United States Patent
Otto et al.

(10) Patent No.: US 11,133,250 B2
(45) Date of Patent: Sep. 28, 2021

(54) SEMICONDUCTOR COMPONENT AND METHOD FOR PRODUCING A SEMICONDUCTOR COMPONENT

(71) Applicant: OSRAM Opto Semiconductors GmbH, Regensburg (DE)

(72) Inventors: Isabel Otto, Regenstauf (DE); Dominik Scholz, Bad Abbach (DE); Christian Leirer, Friedberg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 7 days.

(21) Appl. No.: 16/615,839

(22) PCT Filed: May 17, 2018

(86) PCT No.: PCT/EP2018/062997
§ 371 (c)(1),
(2) Date: Nov. 22, 2019

(87) PCT Pub. No.: WO2018/215312
PCT Pub. Date: Nov. 29, 2018

(65) Prior Publication Data
US 2020/0152568 A1 May 14, 2020

(30) Foreign Application Priority Data
May 23, 2017 (DE) ...................... 10 2017 111 279.0

(51) Int. Cl.
*H01L 23/528* (2006.01)
*H01L 23/532* (2006.01)

(52) U.S. Cl.
CPC ...... *H01L 23/528* (2013.01); *H01L 23/53223* (2013.01); *H01L 23/53238* (2013.01); *H01L 23/53266* (2013.01)

(58) Field of Classification Search
None
See application file for complete search history.

(56) References Cited

U.S. PATENT DOCUMENTS 10,249,798 B2 * 4/2019 Kim ........................ H01L 33/62
2014/0190732 A1 7/2014 Bergenek et al.
(Continued)

FOREIGN PATENT DOCUMENTS

DE    102011079708 A1    1/2013
DE    102011115659 A1    3/2013
(Continued)

OTHER PUBLICATIONS

International Search Report issued for corresponding PCT-Application No. PCT/EP2018/062997, dated Aug. 28, 2019, 3 pages (for informational purpose only).
(Continued)

*Primary Examiner* — Hsien Ming Lee
(74) *Attorney, Agent, or Firm* — Viering, Jentschura & Partner mbB (57) ABSTRACT

A semiconductor component may have a semiconductor body and an electrically conductive carrier layer. The semiconductor body may include a first semiconductor layer and a second semiconductor layer, a first main face and a second main face, situated opposite the first main face, wherein the first main face is formed by a surface of the first semiconductor layer and the second main face is formed by a surface of the second semiconductor layer. The semiconductor body may further include at least one side face connecting the first main face to the second main face. The electrically conductive carrier layer may regionally cover the second main face the carrier layer is structured in such a way that it has at least one contact-free depression. Furthermore, a method for producing such a semiconductor component is disclosed.

16 Claims, 9 Drawing Sheets

(56) References Cited

U.S. PATENT DOCUMENTS

| | | | |
|---|---|---|---|
| 2014/0283903 A1 | 9/2014 | Von Malm et al. | |
| 2016/0027732 A1* | 1/2016 | Igarashi ............ | H01L 23/49575 |
| | | | 257/531 |
| 2018/0358512 A1 | 12/2018 | Hoeppel et al. | |

FOREIGN PATENT DOCUMENTS

| | | |
|---|---|---|
| DE | 102015100578 A1 | 7/2016 |
| DE | 102015114583 A1 | 3/2017 |
| WO | 2016076637 A1 | 5/2016 |

OTHER PUBLICATIONS

German Search Report issued for corresponding German application No. 10 2017 111 279.0, dated Dec. 20, 2017, 6 pages (for informational purpose only).

* cited by examiner

SEMICONDUCTOR COMPONENT AND METHOD FOR PRODUCING A SEMICONDUCTOR COMPONENT

CROSS-REFERENCE TO RELATED APPLICATIONS

The present application is a national stage entry according to 35 U.S.C. § 371 of PCT application No.: PCT/EP2018/062997 filed on May 17, 2018; which claims priority to German Patent Application Serial No.: 10 2017 111 279.0, which was filed on May 23, 2017; both of which are incorporated herein by reference in their entirety and for all purposes.

TECHNICAL FIELD

A semiconductor component and a method for producing a semiconductor component are provided.

BACKGROUND

In semiconductor components, defects, for example cracks or delaminations, may occur under mechanical loads because of comparatively poor deformability of some layers of material and can spread and impair the quality of the semiconductor components.

SUMMARY

One object to be achieved in the present case is that of specifying a mechanically stable semiconductor component. Furthermore, one object to be achieved is that of specifying a method for producing such a semiconductor component.

According to at least one embodiment, the semiconductor component includes a semiconductor body having a first semiconductor layer and a second semiconductor layer. Furthermore, the semiconductor body has a first main face and a second main face, situated opposite the first main face, wherein in particular the first main face is formed by a surface of the first semiconductor layer and the second main face is formed by a surface of the second semiconductor layer. In particular, the first main face and the second main face delimit the semiconductor body in a vertical direction.

Furthermore, the semiconductor body has at least one side face connecting the first main face to the second main face. The number of side faces is determined by the geometry of the semiconductor body. In particular, the semiconductor body has a plurality of side faces. This is the case for example if the semiconductor chip is of a cuboidal form and correspondingly has four side faces. The at least one side face is arranged largely transversely to the first and second main faces. "Transversely" means that a normal vector of the side face does not run parallel to a normal vector of the first and/or second main face. In non-limiting embodiments, the at least one side face delimits the semiconductor body in one or more lateral directions. The lateral directions are arranged in a plane of which the normal vector is arranged parallel to the vertical direction. In particular, the direction in which the second semiconductor layer follows the first semiconductor layer is referred to as the vertical direction.

Furthermore, the at least one side face may be a face that is made up of at least two sub-faces. For example, the sub-faces may be planar faces, in particular the surface normals of two sub-faces that are adjacent to one another running transversely, that is to say not parallel, to one another.

The first semiconductor layer may have a first conductivity and the second semiconductor layer may have a second conductivity. In non-limiting embodiments, the first semiconductor layer is an n-conducting layer. Furthermore, the second semiconductor layer is in particular a p-conducting layer. The semiconductor body may have further semiconductor layers between the first and second semiconductor layers.

According to at least one embodiment, in the present case the semiconductor component is an optoelectronic component. Here, the semiconductor body has an active zone suitable for radiation generation or for radiation detection. In particular, the active zone is a p-n junction zone. The active zone may in this case be formed as one layer or as a layer sequence of a plurality of layers. For example, during the operation of the semiconductor component the active zone emits electromagnetic radiation, for instance in the visible, ultraviolet or infrared spectral range. Alternatively, during the operation of the semiconductor component the active zone may absorb electromagnetic radiation and convert it into electrical signals or electrical energy. The active zone is in particular arranged between the first semiconductor layer and the second semiconductor layer.

Materials based on nitride compound semiconductors come into consideration for the layers of the semiconductor body. "Based on nitride compound semiconductors" means in the present context that at least one layer of the semiconductor body includes a nitride III/V compound semiconductor material, such as $Al_nGa_mIn_{1-n-m}N$, where $0 \leq n \leq 1$, $0 \leq m \leq 1$ and $n+m \leq 1$. This material does not in this case necessarily have to have a mathematically exact composition in accordance with the above formula. Rather, it may include one or more dopants as well as additional constituents that do not substantially change the characteristic physical properties of the $Al_nGa_mIn_{1-n-m}N$ material. For the sake of simplicity, however, the above formula only includes the essential constituents of the crystal lattice (Al, Ga, In, N), even if they can to some extent be substituted by small amounts of further substances.

Furthermore, the semiconductor component may have an electrically conducting carrier layer. The carrier layer has in this case a comparatively low electrical resistance. In addition, because of its constitution, for example its thickness and/or its material, the carrier layer is a stabilizing component of the semiconductor component.

The thickness of the carrier layer may be between 2 µm and 100 µm inclusive, in particular between 5 µm and 30 µm, such as between 5 µm and 15 µm, deviations from the values specified of up to 10% being tolerable. The thickness is a maximum extent of the carrier layer in a direction that is arranged perpendicularly to a main plane of extent of the carrier layer.

According to at least one embodiment, the carrier layer is a metallic layer. A "metallic layer" should be understood in this case as meaning a layer that is formed from a metal or a metal compound and is distinguished by at least one of the following properties: high electrical conductivity, which decreases with increasing temperature, high thermal conductivity, ductility (deformability), metallic gloss (mirror finish). Au, Zn, Al, Sn, Ni and Cu or compounds of these materials, such as for example AuSn and NiAu and additionally NiPdAu, come into consideration as materials for the carrier layer. The carrier layer may therefore contain at least one of these materials or consist of one of these materials.

In non-limiting embodiments, the second main face is covered at least regionally by the carrier layer. Particularly, in this case the carrier layer is structured in such a way that it has at least one contact-free depression. In other words, the carrier layer has at least one depression which is not provided for an electrical contact of the semiconductor body. At most 90%, such as at most 80%, of the second main face is covered by the electrically carrier layer. In particular, a degree of coverage of the second main face by the carrier layer is at least 30%, such as 40%, and at most 70%, such as 60%. A carrier layer structured in this way has the advantage that it is more easily deformable and/or more compliant than a carrier layer embodied for example largely without interruptions, with the result that fewer defects, for example cracks or delaminations, arise under mechanical loads.

In one non-limiting configuration, the carrier layer is structured in at least one lateral direction, preferably in a plurality of lateral directions, beyond the edge of the second main face. In non-limiting embodiments, it is also possible for the structured part of the carrier layer to be restricted laterally to the region of the second main face, with the result that a region arranged laterally outside the second main face is embodied without interruptions.

According to at least one embodiment, the contact-free depression, proceeding from a boundary face of the carrier layer facing the second main face, extends through the carrier layer as far as a boundary face of the carrier layer facing away from the second main face. In non-limiting embodiments, the depression extends in a vertical direction through the carrier layer.

Alternatively, the depression can extend only partly into the carrier layer. By way of example, the depression, proceeding from a boundary face of the carrier layer facing the semiconductor body or proceeding from a boundary face of the carrier layer facing away from the semiconductor body, can extend right into the carrier layer.

In one non-limiting configuration, the at least one depression is surrounded fully circumferentially by the carrier layer. In other words, the depression is bounded by the carrier layer in all lateral directions. However, it is also possible for the depression to be partly open at its circumference, wherein the depression is not bounded by the carrier layer in at least one lateral direction.

According to at least one embodiment, the carrier layer is a continuous layer. This means that all regions of the carrier layer are interconnected. This is advantageous in particular with regard to an energization of the semiconductor body by means of the carrier layer.

According to at least one embodiment, a filling is arranged in the depression. In particular, the filling has a higher elasticity than the carrier layer. In this case, the "elasticity" denotes in particular the elastic properties of the material used for the various elements.

By way of example, the filling can be an electrically weakly conductive or insulating material. Suitable materials here are plastics materials such as, for instance, polymers, in particular epoxies or silicones. Alternatively, it is possible for the filling to be formed from an electrically conductive material, with the result that current distribution is furthermore possible by way of the entire or almost the entire region of the second main face. Suitable materials for the filling here are for example metals such as Au, In and Cu. Furthermore, transparent conductive oxides are appropriate. Transparent conductive oxides ("TCOs" for short) are transparent conductive materials, generally metal oxides, such as, for example, zinc oxide, tin oxide, cadmium oxide, titanium oxide, indium oxide or indium tin oxide (ITO).

Alongside binary metal-oxygen compounds such as, for example, ZnO, SnO2 or In2O3, ternary metal-oxygen compounds such as, for example, Zn2SnO4, CdSnO3, ZnSnO3, MgIn2O4, GaInO3, Zn2In2O5 or In4Sn3O12 or mixtures of different transparent conductive oxides also belong to the group of TCOs. The filling can contain at least one of the materials mentioned or consist of one of these materials.

According to at least one embodiment, the depression has regions having a different lateral orientation. In this case, the regions are characterized in particular by a longer and a shorter lateral extent, wherein the lateral orientation corresponds to the direction in which the region has its longer lateral extent. The depression can have at least one curvature in a plan view of the carrier layer, wherein the regions merging into one another at the curvature have a different lateral orientation.

In one non-limiting configuration, the depression has a plurality of first regions, which have a first lateral orientation and are arranged in a manner laterally offset with respect to one another. Furthermore, the depression can have further regions, which have a different lateral orientation than the first lateral orientation and in each case connect two first regions to one another. By way of example, the depression can be embodied in a meandering fashion in a plan view of the carrier layer. Furthermore, the depression can be embodied in the manner of a zigzag line or wavy line in a plan view of the carrier layer. In this case, the individual regions of the depression have a three-dimensional shape that is like a polyhedron, in particular a cuboid.

According to a further embodiment, the carrier layer can have a plurality of depressions arranged in a manner laterally offset with respect to one another. The depressions can follow a regular pattern, for example a pattern including one or more polygons, wherein a respective depression is arranged at the corners of a polygon. In this case, the depressions have a three-dimensional shape that is like a polyhedron, in particular a cuboid, or a cylinder.

According to at least one embodiment, the semiconductor component has a seed layer, on which the carrier layer is applied. In this case, the seed layer is arranged between the semiconductor body and the carrier layer. In particular, the carrier layer is deposited electrolytically on the seed layer. In a non-limiting embodiment, the seed layer is a metallic layer. By way of example, the seed layer can contain one of the materials Au, Ti, Cu, Al, Ag, Sn, Rh, Ni or Pt or consist of one of these materials. The seed layer can have a thickness of at least 50 nm, such as of 200 nm.

In one non-limiting configuration, the seed layer has a structure corresponding to the carrier layer. In this case, the seed layer can also be structured in such a way that it has at least one contact-free depression. The contact-free depression of the seed layer has the same lateral position as the contact-free depression of the carrier layer. Furthermore, the contact-free depression of the seed layer has in particular the same lateral size and/or shape as the contact-free depression of the carrier layer. A structured seed layer has the advantage, for example, that the carrier layer can be applied in already structured form. The method step in which structuring of the carrier layer is carried out is thus obviated.

Alternatively, the seed layer, on which the carrier layer is applied, can have a different structure than the carrier layer. In non-limiting embodiments, a coverage of the second main face by the seed layer is in this case greater than the coverage of the second main face by the carrier layer. In particular, the seed layer is embodied for the most part without interruptions, and so at least 50%, in particular at least 80%, such as at least 90%, of the second main face is covered by the seed layer. The seed layer therefore has in particular only a few locations at which there are interruptions, that is to say regions of reduced thickness.

In one non-limiting configuration, the carrier layer extends from the second main face to at least one side face of the semiconductor body. In particular, the carrier layer can extend to at least one side face of the first semiconductor layer. In this case, side faces of the second semiconductor layer can be completely covered by the carrier layer.

Furthermore, at least one side face of the semiconductor component is formed regionally by a side face of the carrier layer. In particular, a plurality of side faces of the semiconductor component are formed regionally by side faces of the carrier layer. The semiconductor component is thus at least partly laterally delimited by side faces of the carrier layer.

According to at least one embodiment of the semiconductor component, the semiconductor body has at least one cutout that extends from the second main face in the direction of the first main face and which ends in the first semiconductor layer. The cutout is surrounded fully circumferentially by the semiconductor body, for example. The semiconductor body can have a plurality of such cutouts. In non-limiting embodiments, the carrier layer is arranged in the at least one cutout. Said carrier layer advantageously serves for electrically contacting the first semiconductor layer, specifically from the side of the second main face.

According to at least one embodiment, the semiconductor component has on the side of the second main face a first connection contact for electrically contacting the first semiconductor layer and a second connection contact for electrically contacting the second semiconductor layer. In this case, the first connection contact may be connected in an electrically conducting manner to the carrier layer. Furthermore, the second connection contact may be connected in an electrically conducting manner to a connection layer, which is connected in an electrically conducting manner to the second semiconductor layer.

In one non-limiting configuration, the carrier layer has at least one cutout which is different than the contact-free depression and in which a connection contact is arranged. This involves, in particular, a second connection contact serving for electrically contacting the second semiconductor layer.

According to at least one embodiment, the semiconductor component has a molded-on main body, which is arranged on the semiconductor body. In the vertical direction, the carrier layer is arranged between the semiconductor body and the main body. In non-limiting embodiments, the first and second connection contacts are embedded in the main body. In this case, the first and second connection contacts extend in particular from the side of the semiconductor body through the main body to a surface of the main body facing away from the semiconductor body.

The main body may for example be formed by a molding method. In particular, the main body is produced from a moldable plastic, for instance a polymer such as resin, epoxy or silicone. Advantageously, the carrier layer arranged between the semiconductor body and the main body can protect the plastics material of the main body against the electromagnetic radiation of the semiconductor body, said radiation leading for example to accelerated aging of the main body. A molding method is generally understood as meaning a method by which a molding compound is shaped according to a prescribed form, with preference under the effect of pressure, and if required is cured. In particular, the term "molding method" includes molding, film assisted molding, injection molding, transfer molding and compression molding.

According to at least one embodiment of a method for producing a semiconductor component, it has the following steps:
providing a semiconductor body having
a first semiconductor layer and a second semiconductor layer,
a first main face and a second main face, situated opposite the first main face, wherein the first main face is formed by a surface of the first semiconductor layer and the second main face is formed by a surface of the second semiconductor layer,
at least one side face connecting the first main face to the second-main face,
applying an electrically conductive carrier layer on the second main face, wherein the carrier layer is embodied with a structure in such a way that it has at least one contact-free depression.

In non-limiting embodiments, the aforementioned method steps are carried out in the specified sequence.

According to at least one embodiment of the method, firstly a seed layer is applied on the semiconductor body. In particular, the seed layer is applied on the semiconductor body by sputtering or vapor deposition.

In one non-limiting configuration, the seed layer is left unstructured, with the result that the second main face is covered at least for the most part by the seed layer. A carrier layer can then be deposited on the seed layer by means of a coating method, by means of an electrolytic coating method. In this case, the carrier layer is applied on the seed layer over the whole area. Afterward, a structuring of the carrier layer, for example by means of a photomask, can be carried out in such a way that said carrier layer has at least one depression that is contact-free in the finished semiconductor component. If the seed layer is left largely unstructured, then it has a different structure than the carrier layer in the finished semiconductor component.

If the seed layer is structured together with the carrier layer, it has a structure corresponding to the carrier layer, in particular, in the finished semiconductor component. This can also be achieved by the seed layer being structured before the carrier layer is applied. Afterward, the carrier layer can be deposited, for example electrolytically, on the structured seed layer and can thereby already be embodied with a structure.

In one non-limiting configuration, furthermore, the connection contacts are applied on the semiconductor body by means of a coating method, such as by means of an electrolytic coating method. In this case, a further seed layer, which is applied in particular by sputtering or vapor deposition, can serve as the seed layer for the connection contacts. For example, the further seed layer may contain one of the materials Au, Ti, Cu, Al, Ag, Sn, Rh, Ni or Pt or consist of one of these materials.

The first and second semiconductor layers may be produced layer by layer one after the other on a growth substrate by means of an epitaxy method. Sapphire, Sic and/or GaN for example come into consideration as materials for the growth substrate. The growth substrate may be at least partially removed after the production of the semiconductor body, so that the first main face or a surface of the first semiconductor layer is at least partially exposed. By way of example, a laser lift-off method is appropriate for detaching the growth substrate, on which the first and second semiconductor layers are arranged. In this process, pressure waves or mechanical loads can arise in the semiconductor body, and they can advantageously be reduced by virtue of the deformability of the structured carrier layer. As a result, it is possible to suppress the occurrence of defects.

For producing a plurality of semiconductor components, a wafer assemblage can be provided, having a semiconductor layer sequence including a first semiconductor layer and a second semiconductor layer, a plurality of first connection contacts, a plurality of second connection contacts and at least one or a plurality of continuous carrier layers. The wafer assemblage may have a plurality of isolation trenches, along which the wafer assemblage can be divided up into a plurality of semiconductor components. A complete penetration of the semiconductor layer sequence by the isolation trenches is not necessary here. Rather, the isolation trenches may extend through the second semiconductor layer and the active layer into the first semiconductor layer and end there. Alternatively, it is also possible that the isolation trenches extend in the vertical direction through the entire wafer assemblage, so that separate semiconductor bodies or semiconductor components are already produced by the formation of the isolation trenches. This variant is advantageous in particular if the semiconductor bodies are intended to be covered at the side faces with a material, for example with a reflective material.

According to at least one embodiment of a method for producing one or a plurality of the semiconductor components described here, a main body assemblage is molded onto the wafer assemblage. For forming the main body assemblage, a material suitable for it is applied to the wafer assemblage in such a way that the isolation trenches and intermediate regions between the connection contacts are at least partially or completely filled. In a subsequent method step, the wafer assemblage and the main body assemblage are singulated along the isolation trenches into a plurality of semiconductor components in such a way that the semiconductor components have in each case a semiconductor body, a carrier layer and a main body, wherein a first connection contact and a second connection contact are embedded in the main body.

The method described above is particularly suitable for the production of one or a plurality of the semiconductor components described here. Therefore, features described in connection with the semiconductor component can also be used for the method, and vice versa.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the illumination apparatus. In the following description, various aspects are described with reference to the following drawings, in which.

DETAILED DESCRIPTION

Figure 1A:
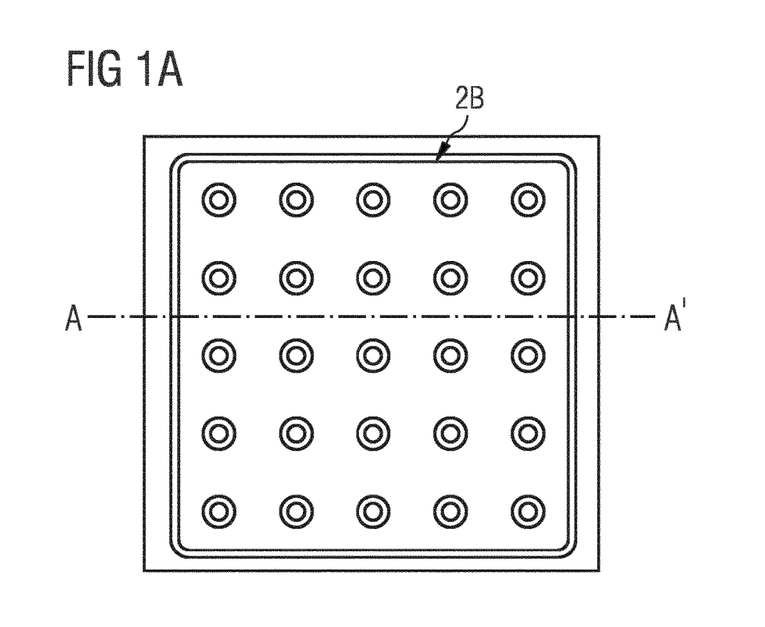
FIG. 1A shows a schematic plan view and FIG. 1B shows a schematic cross-sectional view of a method step and of a semiconductor component in an intermediate stage of a method according to a first exemplary embodiment.
Figure 1B:
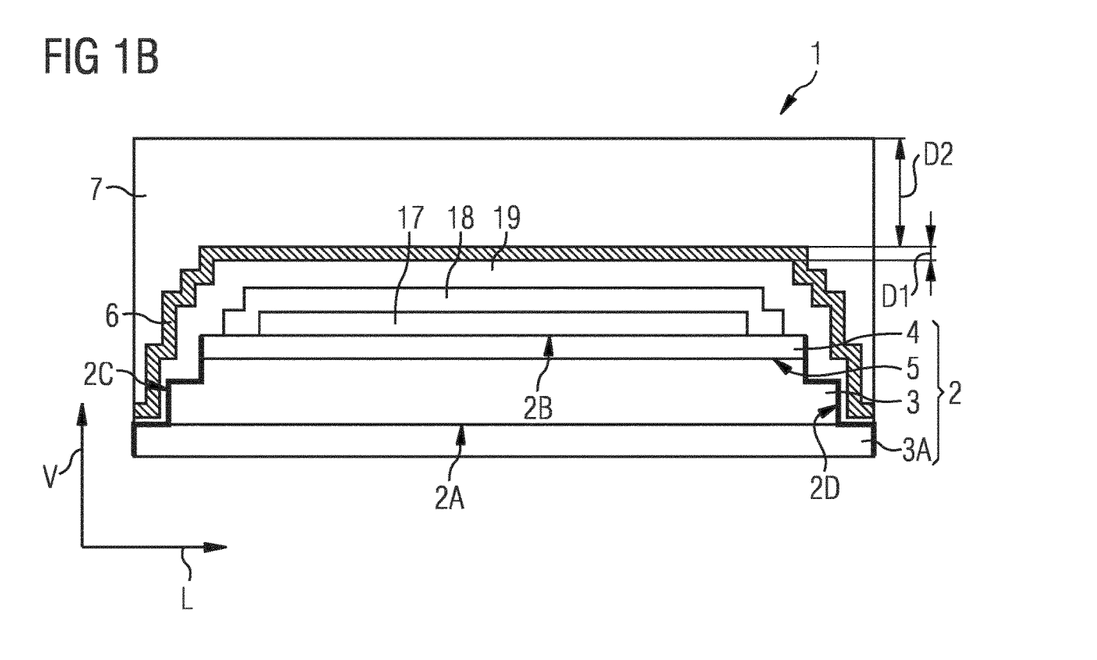

FIGS. 1A and 1B illustrate an intermediate stage of a method for producing a semiconductor component 1 and an intermediate stage of a semiconductor component 1 described in the present case. FIG. 1A shows the unfinished semiconductor component 1 in a plan view of a second main face 2B of the semiconductor body 2. FIG. 1B shows a cross section of the unfinished semiconductor component 1 along the line AA' illustrated in FIG. 1A.

The unfinished semiconductor component 1 includes a semiconductor body 2 with a first semiconductor layer 3, a second semiconductor layer 4 and a growth substrate 3A, on which the first and second semiconductor layers 3, 4 are arranged. Furthermore, the semiconductor body 2 has a first main face 2A and a second main face 2B, situated opposite the first main face 2A, wherein the first main face 2A is formed by a surface of the first semiconductor layer 3 and the second main face 2B is formed by a surface of the second semiconductor layer 4. In addition, the semiconductor body 2 has a plurality of side faces 2C, 2D connecting the first main face 2A to the second main face 2B. In particular, the first main face 2A and the second main face 2B delimit the semiconductor body 2 in the finished semiconductor component (cf. FIG. 3) in a vertical direction V, while the side faces 2C, 2D delimit the semiconductor body 2 in lateral directions L. The lateral directions L in this case run transversely, in particular perpendicularly, to the vertical direction V. The side faces 2C, 2D may be made up in each case of multiple sub-faces, in particular the individual sub-faces being in each case planar surfaces and the surface normals of two sub-faces that are adjacent to one another running transversely, that is to say not parallel, to one another.

Between the first semiconductor layer 3 and the second semiconductor layer 4, the semiconductor body 2 has an active zone 5, which is provided for radiation generation. In particular, the active zone 5 is a p-n junction zone. The active zone 5 may in this case be formed as one layer or as a layer sequence of a plurality of layers.

The first semiconductor layer 3 may have a first conductivity and the second semiconductor layer 4 may have a second conductivity. In non-limiting embodiments, the first semiconductor layer 3 is an n-conducting layer. Furthermore, the second semiconductor layer 4 is in particular a p-conducting layer.

Materials based on nitride compound semiconductors come into consideration for the layers of the semiconductor body 2.

The semiconductor component 1 includes a seed layer 6 arranged between the semiconductor body 2 and the carrier layer 7. In non-limiting embodiments, the seed layer 6 is a metallic layer. For example, the seed layer 6 may contain one of the materials Au, Ti, Cu, Al, Ag, Sn, Rh, Ni or Pt or consist of one of these materials. The seed layer 6 can have a thickness D1 of at least 100 nm, such as of 500 nm.

In particular, the seed layer 6 is applied on the semiconductor body 2, or on layers already arranged on the semiconductor body 2, by sputtering or vapor deposition. In this case, the second main face 2B can be completely covered by the seed layer 6. Furthermore, the side faces 2C, 2D of the semiconductor body 2 can be covered at least regionally by the seed layer 6.

Furthermore, the semiconductor component 1 includes an electrically conductive carrier layer 7, which covers the second main face 2B completely and the side faces 2C, 2D of the semiconductor body 2 at least regionally. In this case, the carrier layer 7 extends from the second main face 2B over side faces of the second semiconductor layer 4 to side faces of the first semiconductor layer 3. In particular, the carrier layer 7 is a metallic layer. For example, Au, Zn, Al, Sn, Ni and Cu or compounds of these materials, such as for example AuSn and NiAu and additionally NiPdAu, come into consideration as materials for the carrier layer 7.

The carrier layer 7 can contain at least one of these materials or consist of one of these materials.

The carrier layer 7 can be deposited on the seed layer 6 by means of a coating method, by means of an electrolytic coating method. In this case, the carrier layer 7 is applied on the seed layer 6 over the whole area. A thickness D2 of the carrier layer 7 may be between 2 μm and 100 μm inclusive, in particular between 5 μm and 30 μm, such as between 5 μm and 15 μm, deviations from the values specified of up to 10% being tolerable.

Between the seed layer 6 and the semiconductor body 2, the semiconductor component 1 may have further layers. For example, a connection layer 17, which directly adjoins the second semiconductor layer 4, may be provided. With preference, the connection layer 17 is formed from an electrically conducting and highly reflective material. For example, the connection layer 17 is an electrically conducting mirror layer. For example, the connection layer 17 may contain Ag or consist thereof. However, it is also possible for the connection layer 17 to be formed from a transparent conductive oxide ("TCO" for short).

Furthermore, a current spreading layer 18 may be arranged adjacent to the connection layer 17. The current spreading layer 18 may be formed as a stack of layers including a plurality of metal layers. In particular, the current spreading layer 18 may include metals such as Pt, Au, Cu, Al, Ag, Sn, Rh and Ti.

Furthermore, a passivation layer 19 can be provided between the seed layer 6 and the semiconductor body 2. In this case, the passivation layer 19 can cover the semiconductor body 2, the connection layer 17 and the current spreading layer 18 regionally, in particular completely.

Figure 2A:
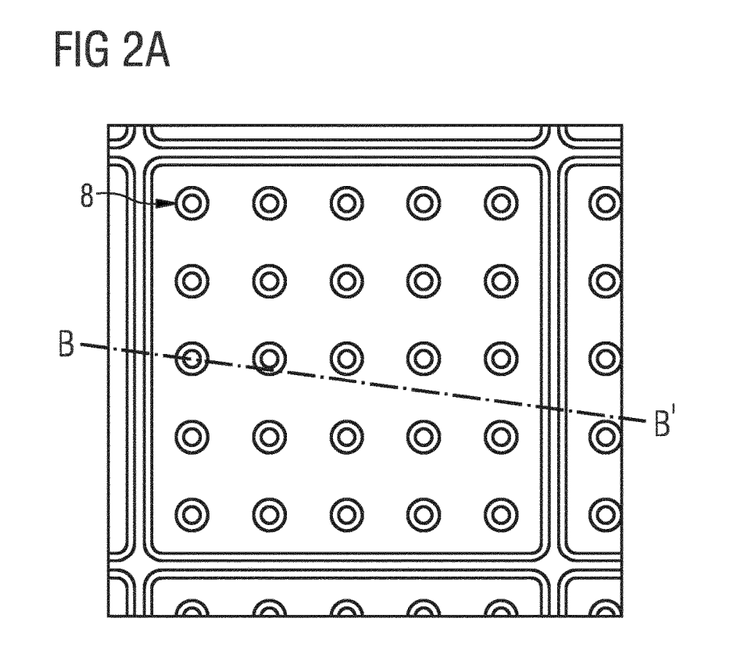
FIG. 2A shows a schematic plan view and FIG. 2B shows a further schematic cross-sectional view of the same method step and of the same semiconductor component in the intermediate stage of the method according to the first exemplary embodiment.
Figure 2B:
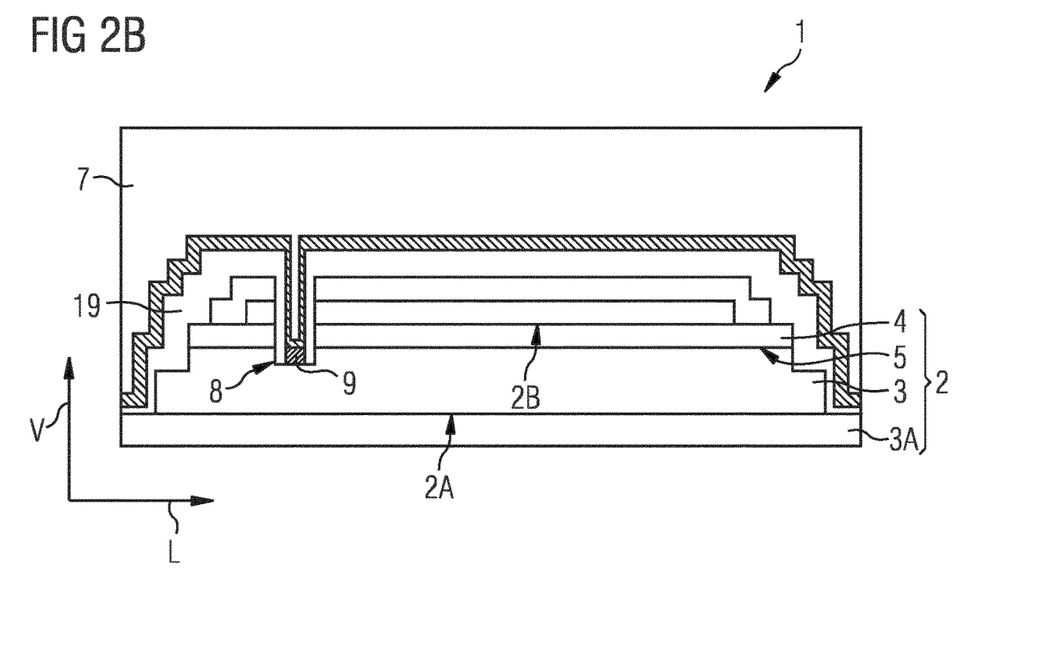

FIG. 2B shows the intermediate stage already described above of a method and of a semiconductor component 1 in another view, a cross section along the line BB' that is illustrated in FIG. 2A being shown in FIG. 2B.

The semiconductor body 2 has a cutout 8, which extends from the second main face 2B in the direction of the first main face 2A and ends in the first semiconductor layer 3. The cutout 8 is surrounded fully circumferentially by the semiconductor body 2 in lateral directions. As can be seen from FIG. 2A, the semiconductor body 2 has a plurality of such cutouts 8. The carrier layer 7 is arranged in the cutout 8. Said carrier layer advantageously serves for electrically contacting the first semiconductor layer 3 from the side of the second main face 2B. For improved electrical contacting of the first semiconductor layer 3, a contact element 9 may be arranged in direct contact with it in the cutout 8. The carrier layer 7 arranged in the cutout 8 is electrically insulated from the adjacent layers by an insulation laterally surrounding it. By way of example, the passivation layer 19 extends right into the cutout 8 and thus provides for an electrical insulation of the carrier layer 7 vis-à-vis the layers surrounding it.

Between the intermediate stage, described in connection with FIGS. 1 and 2, and the final stage, illustrated in FIG. 3, of a method and of a semiconductor component 1, further method steps are performed.

Firstly, a structuring of the carrier layer 7, for example by means of a photomask, can be carried out in such a way that it has a plurality of depressions 10 that are contact-free in the finished semiconductor component 1. In this case, the structured part of the carrier layer 7 is restricted laterally to the region of the second main face 2B, wherein a region of the carrier layer 7 that is arranged laterally outside the second main face 2B is embodied without interruptions. The seed layer 6 is not concomitantly structured or not provided with such depressions, and so it has a different structure than the carrier layer 7 in the finished semiconductor component 1.

Furthermore, at least one cutout 11 which is different than the contact-free depression 10 and in which a connection contact 14 is arranged is formed in the carrier layer 7. Said connection contact is a second connection contact 14 serving for electrically contacting the second semiconductor layer 4. The cutout 11 extends from a boundary face 7A of the carrier layer 7 facing away from the seed layer 6 through the carrier layer 7 as far as a boundary face 7B of the carrier layer 7 facing the seed layer 6. That is to say that the carrier layer 7 is completely penetrated by the cutout 11 in particular in a vertical direction V. Furthermore, the cutout 11 continues right into the seed layer 6 and penetrates completely through the latter.

Furthermore, an insulation layer 12 can be formed on the boundary face 7A of the carrier layer 7 facing away from the semiconductor body 2, wherein the insulation layer 12 extends right into the depressions 10 and the at least one cutout 11. In particular, surfaces bounding the depressions 10 are completely covered by the insulation layer 12.

Finally, first and second connection contacts 13, 14 are formed. In this case, a further seed layer 15 applied in particular by sputtering or vapor deposition can serve as a seed layer for the connection contacts 13, 14.

In addition, a main body 16, into which the connection contacts 13, 14 are embedded, is molded on. The main body 16 advantageously constitutes a further stabilizing component of the semiconductor component 1. The growth substrate 3A may be at least partially removed, so that the first main face 2A or a surface of the first semiconductor layer 3 is at least partially exposed. By way of example, a laser lift-off method is appropriate for detaching the growth substrate 3A. The pressure waves or mechanical loads that occur in the process can advantageously be reduced by virtue of the deformable or relatively compliant carrier layer 7.

Figure 3:
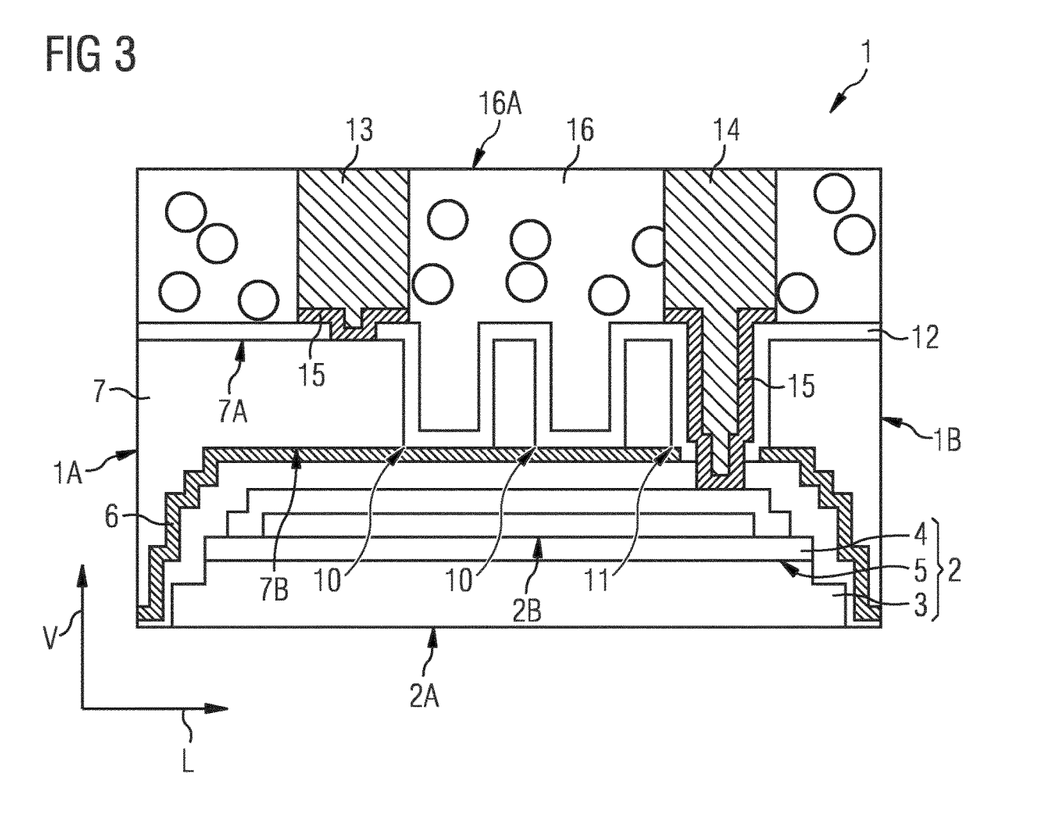
FIG. 3 shows a schematic cross-sectional view of a method step and of a semiconductor component in a final stage of the method according to the first exemplary embodiment.

FIG. 3 shows a finished semiconductor component 1 in a cross-sectional view along the line AA' illustrated in FIG. 1A. The semiconductor component 1 is in particular an optoelectronic semiconductor component. The semiconductor component 1 is provided for the emission of radiation. In this case, during the operation of the semiconductor component 1 the active zone 5 can emit electromagnetic radiation, for instance in the visible, ultraviolet or infrared spectral range. In particular, the electromagnetic radiation is predominantly coupled out of the semiconductor component 1 at the first main face 2A.

The semiconductor component 1 has a first connection contact 13 for electrically contacting the first semiconductor layer 3 and a second connection contact 14 for electrically contacting the second semiconductor layer 4. In this case, the first connection contact 13 is in electrical contact with the carrier layer 7. Furthermore, the second connection contact 14 is arranged in the cutout 11 and extends in a vertical direction V through the carrier layer 7, wherein the second connection contact 14 is in electrical contact with the connection layer 17. The second connection contact 14 is electrically insulated from the carrier layer 7 by the insulation layer 12 arranged in the cutout 11. The insulation layer 12 may be formed from an electrically insulating material, such as silicon oxide and/or silicon nitride.

Furthermore, the semiconductor component 1 has a molded-on main body 16 arranged on the semiconductor body 2. In the vertical direction V, the carrier layer 7 is arranged between the semiconductor body 2 and the main body 16. The first and second connection contacts 13, 14, proceeding from the semiconductor body 2, extend through the main body 16 as far as a surface 16A of the main body 16 that is arranged on a side of the main body 16 facing away from the second main face 2B. The connection contacts 13, 14 are enclosed by the main body 16 fully circumferentially in lateral directions L.

The carrier layer 7 has a plurality of contact-free depressions 10 which, proceeding from a boundary face 7B of the carrier layer 7 facing the second main face 2B, extend through the carrier layer 7 as far as a boundary face 7A of the carrier layer 7 facing away from the second main face 2B. Firstly, the insulation layer 12 is situated in the depressions 10. Secondly, a filling is arranged in the depressions 10. In the first exemplary embodiment, the filling is formed by the main body 16 extending right into the depressions 10. The main body 16 is formed from a plastics materials, in particular.

In the exemplary embodiment illustrated, side faces 1A, 1B of the semiconductor component 1 are formed regionally by side faces of the carrier layer 7. The semiconductor component 1 is thus partly delimited by side faces of the carrier layer 7 in lateral directions L.

In the semiconductor component 1, by means of the structured carrier layer 7, which is more easily deformable than a carrier layer embodied largely without interruptions, for example, mechanical loads can advantageously be reduced, with the result that fewer defects, for example cracks or delaminations arise.

Figure 4A:
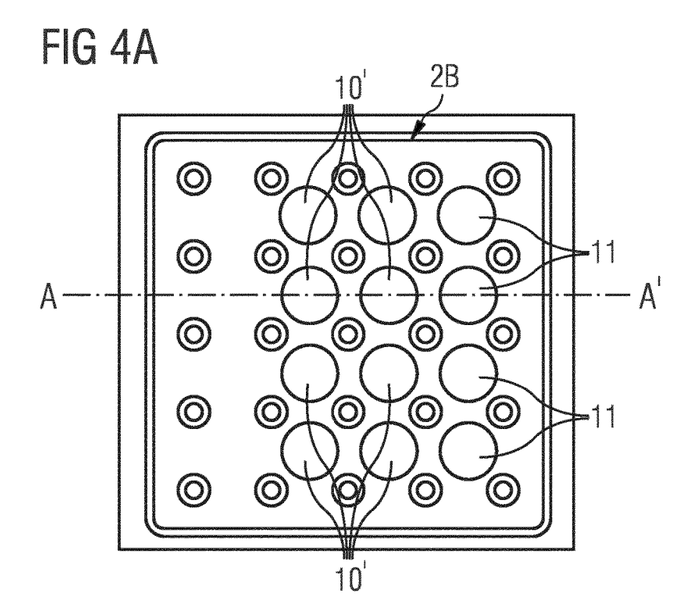
FIG. 4A shows a schematic plan view and FIG. 4B shows a schematic cross-sectional view of a method step and of a semiconductor component in an intermediate stage of a method according to a second exemplary embodiment.
Figure 4B:
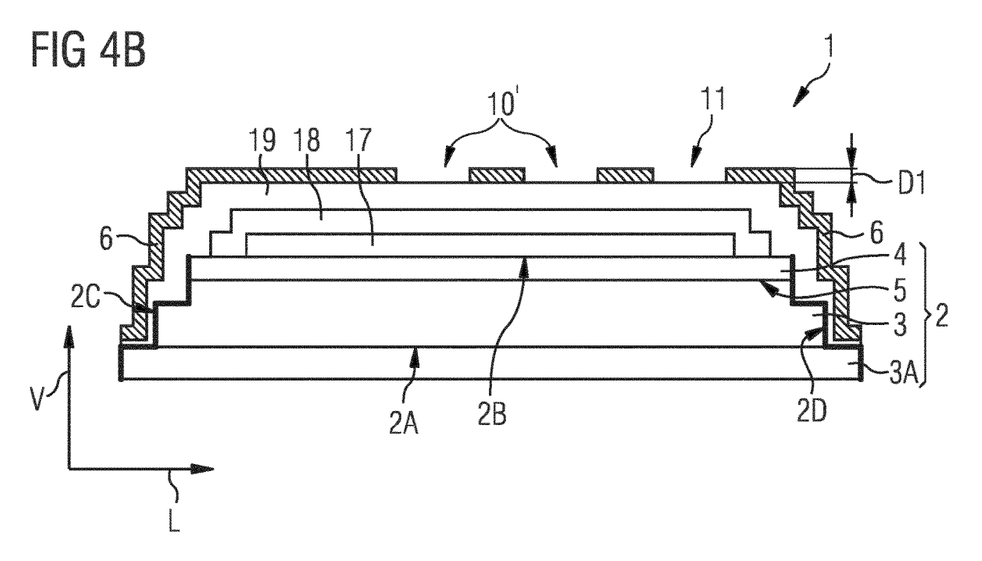

FIGS. 4A and 4B illustrate an intermediate stage of a method for producing a semiconductor component 1 and of a semiconductor component 1 according to a second exemplary embodiment. FIG. 4A shows the unfinished semiconductor component 1 in a plan view of a second main face 2B of the semiconductor body 2. FIG. 4B shows a cross section of the unfinished semiconductor component 1 along the line AA' illustrated in FIG. 4A.

The semiconductor component 1 includes a semiconductor body 2 and also a seed layer 6 arranged on the semiconductor body 2. Between the seed layer 6 and the semiconductor body 2, the semiconductor component 1 has a connection layer 17, a current spreading layer 18 and a passivation layer 19. The semiconductor body 2 and also the connection layer 17, the current spreading layer 18 and the passivation layer 19 have, in particular, the properties already mentioned in connection with the first exemplary embodiment. The seed layer 6 can be embodied identically to the first exemplary embodiment with regard to its thickness D1 and the materials used.

With regard to its structure, the seed layer 6 according to the second exemplary embodiment differs from the first exemplary embodiment. The seed layer 6 is structured in such a way that it has a plurality of contact-free depressions 10'. The seed layer 6 can firstly be formed on the second main face 2B over the whole area and subsequently be structured, for example with a photomask, with the result that it has the depressions 10' and also the cutouts 11.

Figure 5A:
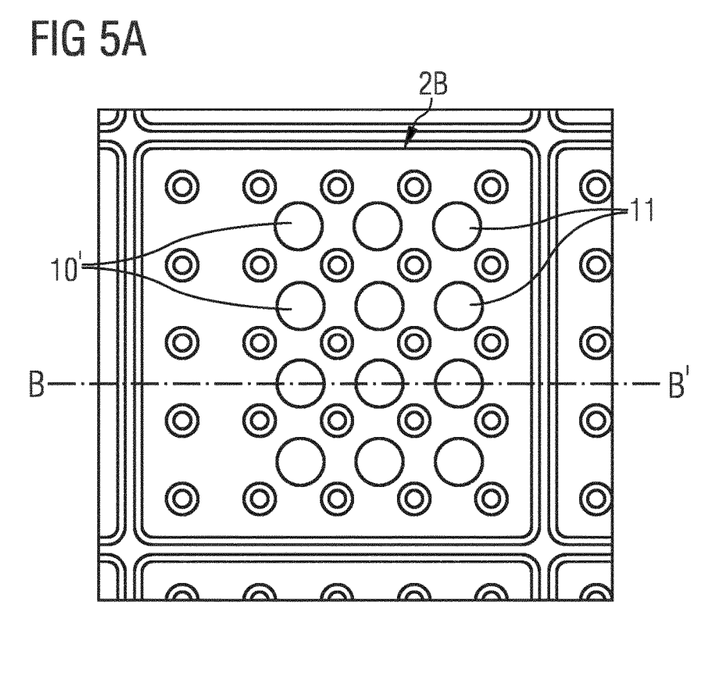
FIG. 5A shows a schematic plan view and FIG. 5B shows a schematic cross-sectional view of a further method step and of a semiconductor component in a further intermediate stage of the method according to the second exemplary embodiment.
Figure 5B:
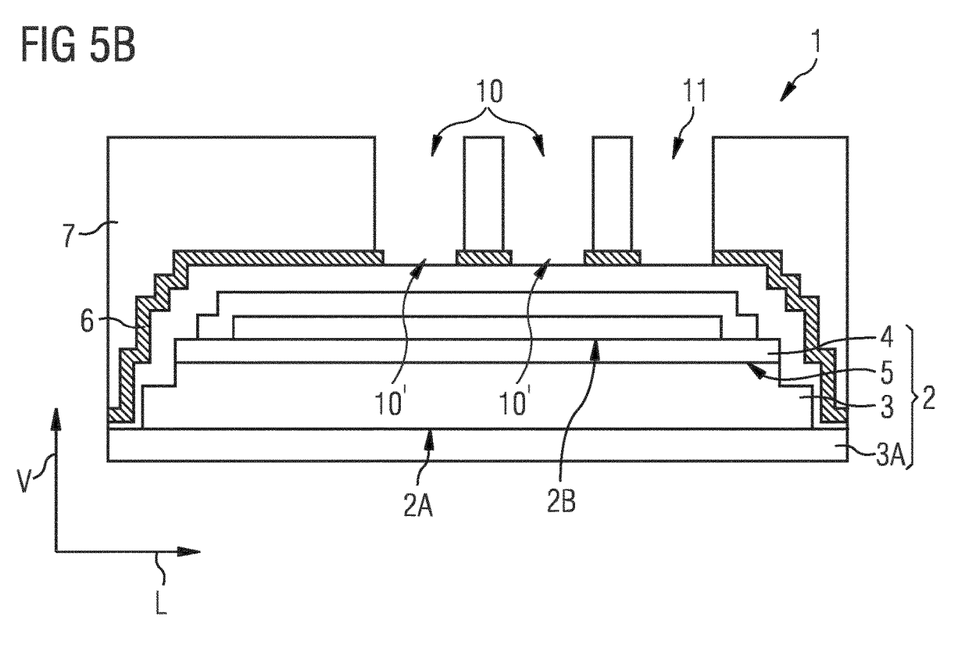

FIGS. 5A and 5B illustrates a further intermediate stage of the method for producing the semiconductor component 1 and of the semiconductor component 1 according to the second exemplary embodiment. FIG. 5A shows the unfinished semiconductor component 1 in a plan view of a second main face 2B of the semiconductor body 2. FIG. 5B shows a cross section of the unfinished semiconductor component 1 along the line BB' illustrated in FIG. 5A.

The carrier layer 7 is deposited electrolytically on the structured seed layer 6 and is thereby already embodied with a structure in such a way that it has a plurality of contact-free depressions 10. In this case, the contact-free depressions 10' of the seed layer 6 and the contact-free depressions 10 of the carrier layer 7 have the same lateral position. Furthermore, the depressions 10' of the seed layer 6 and of the carrier layer 7 have, in particular, in each case the same lateral shape and/or size. Furthermore, the carrier layer 7 has, in particular, the properties already mentioned in connection with the first exemplary embodiment.

Between the intermediate stages, described in connection with FIGS. 4 and 5, and the final stage, illustrated in FIG. 6, of a method and of a semiconductor component 1, further method steps are performed. The latter may largely correspond to the method steps according to the first exemplary embodiment. One difference results from the structured seed layer 6 having a plurality of depressions 10'. In this case, the insulation layer 12 extends right into the depressions 10' of the seed layer 6 and completely fills the latter.

Figure 6:
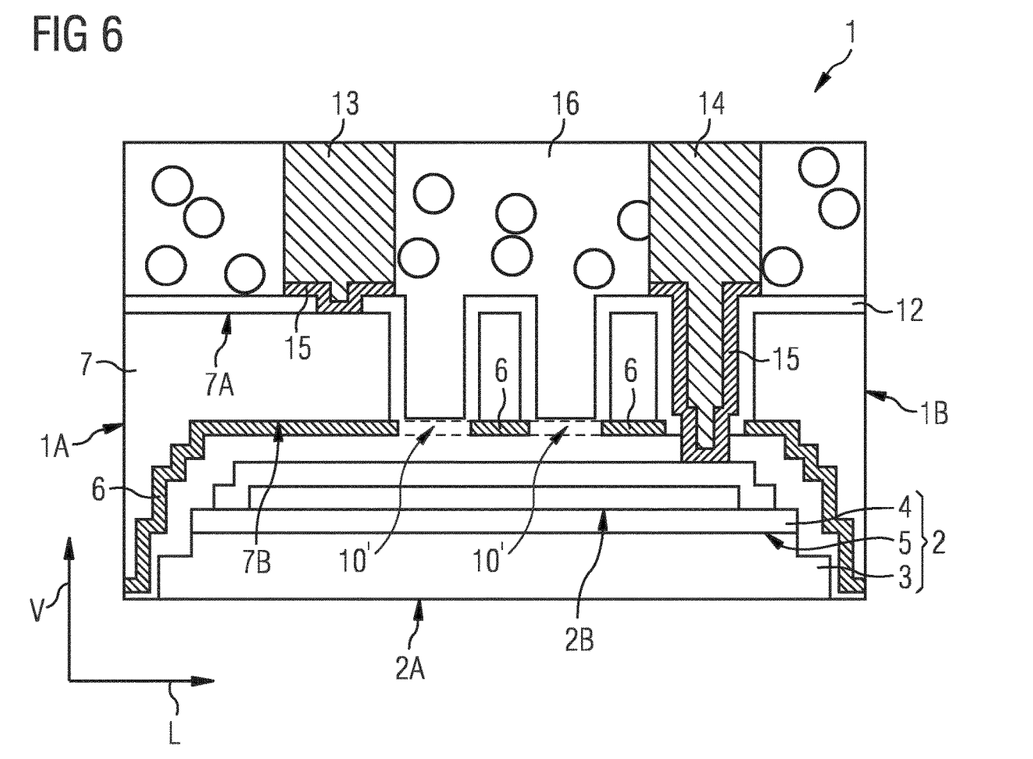
FIG. 6 shows a schematic cross-sectional view of a method step and of a semiconductor component in a final stage of the method according to the second exemplary embodiment.

FIG. 6 shows a finished semiconductor component 1 in a cross-sectional view along the line AA' illustrated in FIG. 4A or along the line BB' illustrated in FIG. 5A. In this case, the seed layer 6 has a structure corresponding to the carrier layer 7. Otherwise, the properties already mentioned in connection with the first exemplary embodiment are applicable to the semiconductor component 1.

Various exemplary embodiments of a carrier layer 7 will be described in association with FIGS. 7 to 12, which exemplary embodiments can occur in the semiconductor components 1 according to the first and second exemplary embodiments.

In order to produce a plurality of semiconductor components 1, a wafer assemblage 20 is provided, having at least one or a plurality of continuous carrier layers 7 and also at least one or a plurality of isolation trenches 21, along which the wafer assemblage 20 can be divided up into a plurality of semiconductor components 1. Before the wafer assemblage 20 is singulated, the continuous carrier layer 7 can be structured in such a way that it has one or a plurality of contact-free depressions 10.

Figure 7:
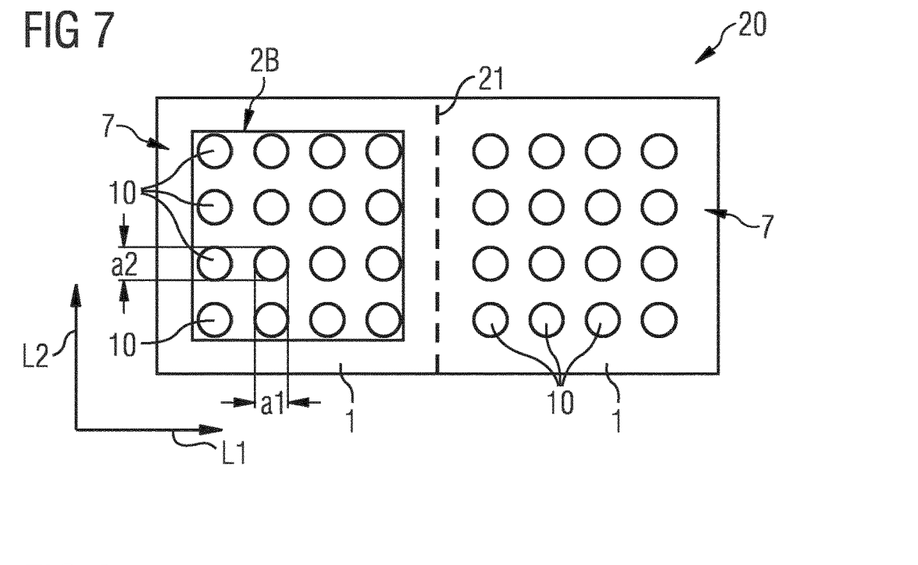
FIGS. 7 to 12 show schematic plan views of a boundary face of the carrier layer according to various exemplary embodiments.
Figure 9:
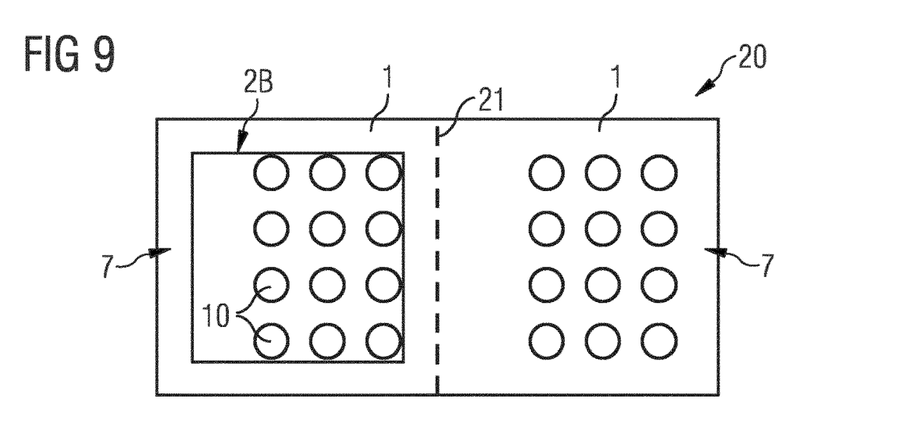

According to the exemplary embodiments illustrated in FIGS. 7 and 9, the structured part of the carrier layer 7 is restricted laterally, that is to say in a first lateral direction L1 and in a second lateral direction L2, to the region of the second main face 2B, with the result that a region arranged laterally outside the second main face 2B is embodied without interruptions. While the structuring extends as far as the edge of the second main face 2B in the case of the exemplary embodiment illustrated in FIG. 7, the carrier layer 7 according to the exemplary embodiment illustrated in FIG. 9 has an unstructured part within the second main face 2B. Thus, for the first connection contact (not illustrated), more space is present than in the case of the exemplary embodiment illustrated in FIG. 7. Furthermore, a good lateral current distribution can be realized by means of a restriction of the structuring to the second main face 2B.

Figure 8:
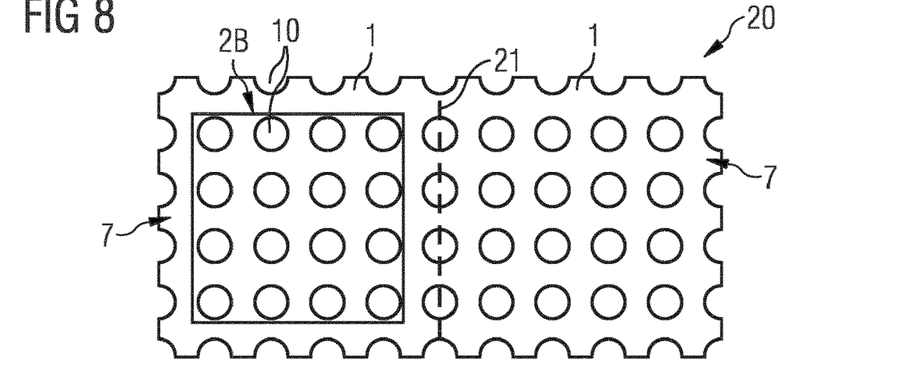

In the exemplary embodiment illustrated in FIG. 8, the carrier layer 7 is structured beyond the edge of the second main face 2B right into the isolation trench 21. Such an extensive structuring of the carrier layer 7 results in an advantageous deformability of the carrier layer 7.

In the exemplary embodiments illustrated in FIGS. 7 to 9, the carrier layer 7 has a plurality of contact-free depressions 10 arranged in a manner laterally offset with respect to one another. The depressions 10 follow a regular pattern composed of a plurality of squares, wherein the depressions 10 are arranged at corners of the squares.

The depressions 10 have a three-dimensional shape like a cylinder. A maximum lateral extent a1 of the depressions 10 in the first lateral direction L1 can be between a few micrometers and 150 µm. A maximum lateral extent a2 of the depressions 10 in the second lateral direction L2 can likewise be between a few micrometers and 150 µm. If the depressions 10 have small lateral extents a1, a2, then the number of depressions 10 is greater than when the depressions 10 have larger lateral extents. The lateral extents a1, a2 or the number of the depressions 10 is restricted by the distance between the cutouts 8.

In the exemplary embodiments illustrated in FIGS. 7 and 9, the depressions 10 are surrounded fully circumferentially by the carrier layer 7. In other words, the depressions 10 are bounded by the carrier layer 7 in all lateral directions L1, L2. By contrast, the depressions arranged at the edge of the semiconductor components 1 according to the exemplary embodiment illustrated in FIG. 8 are partly open at their circumference.

In the exemplary embodiments illustrated in FIGS. 7 to 9, the carrier layer 7 of each semiconductor component 1 is embodied in a continuous fashion, such that all regions of the carrier layer 7 are interconnected.

Figure 10:
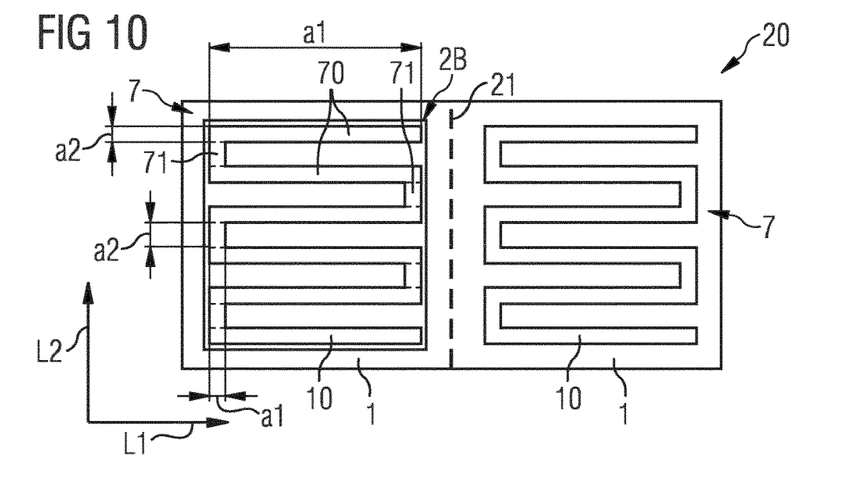
Figure 11:
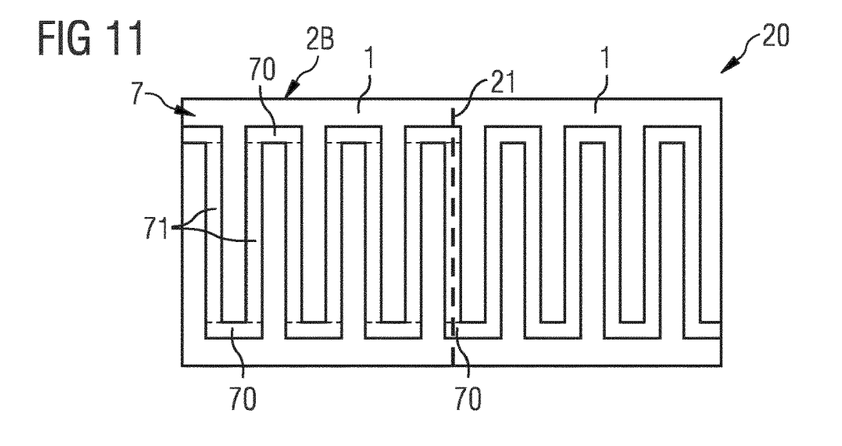
Figure 12:
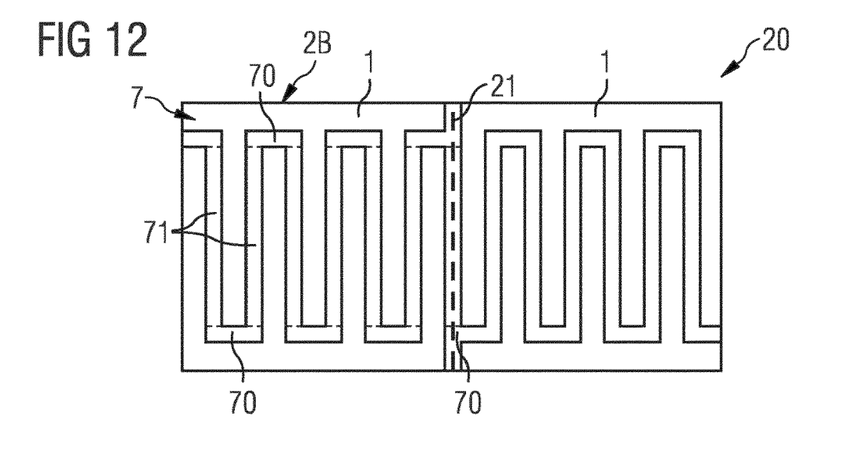

In the exemplary embodiments illustrated in FIGS. 10 to 12, the carrier layer 7 has in each case only one contact-free depression 10.

According to the exemplary embodiment illustrated in FIG. 10, the structured part of the carrier layer 7 is restricted laterally, that is to say in the first lateral direction L1 and in the second lateral direction L2, to the region of the second main face 2B, with the result that a region arranged laterally outside the second main face 2B is embodied without interruptions. Furthermore, a good lateral current distribution can be realized by means of a restriction of the structuring to the second main face 2B.

In the exemplary embodiments illustrated in FIGS. 11 and 12, the carrier layer 7 is structured right into the isolation trenches 21. In this case, the carrier layer 7 can be restricted to the region of the second main face 2B. Thus, the carrier layer 7 in particular does not extend to side faces of the semiconductor body.

The depressions 10 each have first and second regions 70, 71 having a different lateral orientation. In this case, the regions 70, 71 are defined by a first lateral extent a1 and a second lateral extent a2, wherein the lateral orientation corresponds to the direction in which the respective region 70, 71 has its longer lateral extent. The first region 70 is thus oriented along the first lateral direction L1. The second region moreover is oriented along the second lateral direction L2.

A maximum lateral extent a1 of the first regions 70 in the first lateral direction L1 is typically determined by a maximum lateral extent of the semiconductor component 1 in the first lateral direction L1, which is approximately 1000 µm. In particular, the maximum lateral extent a1 of the first regions 70 is smaller by 10-20% than the maximum lateral extent of the semiconductor component 1 and is approximately 800 µm. A maximum lateral extent a2 of the first regions 70 in the second lateral direction L2 can be between 2 µm and 50 µm inclusive, such as between 5 and 10 µm. Furthermore, a maximum lateral extent a1 of the second regions 71 in the first lateral direction L1 can be between 2 µm and 50 µm inclusive, such as between 5 and 10 µm. A maximum lateral extent a2 of the second regions 71 in the second lateral direction L2 can be between 5 µm and 400 µm inclusive, in particular between 40 and 180 µm.

The depressions 10 each have a plurality of curvatures in a plan view of the carrier layer 7, wherein the regions 70, 71 merging into one another at the curvature have a different lateral orientation.

The first regions 70 are arranged in a manner laterally offset with respect to one another. The second regions 71 are likewise arranged in a manner laterally offset with respect to one another. Here in each case two first regions 70 are connected to one another by a second region 71. The depressions 10 are embodied in each case in a meandering fashion in a plan view of the carrier layer 7. In this case, the individual regions 70, 71 of the depressions 10 have a three-dimensional shape that is like a polyhedron, in particular a cuboid.

In the exemplary embodiment illustrated in FIG. 10, the depression 10 is surrounded fully circumferentially by the carrier layer 7. In other words, the depression 10 is bounded by the carrier layer 7 in all lateral directions. By contrast, the depressions 10 extending as far as mutually opposite edges of the semiconductor components 1 according to the exemplary embodiments illustrated in FIGS. 11 and 12 are partly open at their circumference. At the open points the depressions 10 are not bounded by the carrier layer 7.

In the exemplary embodiments illustrated in FIGS. 11 and 12, the isolation trenches 21 extend in each case through first regions 70. While the wafer assemblage 20 is severed along a surface of the carrier layer 7 that bounds the first region 70 according to the exemplary embodiment illustrated in FIG. 11, the division is effected through the middle of the first region 70 according to the exemplary embodiment illustrated in FIG. 12.

Figure 13:
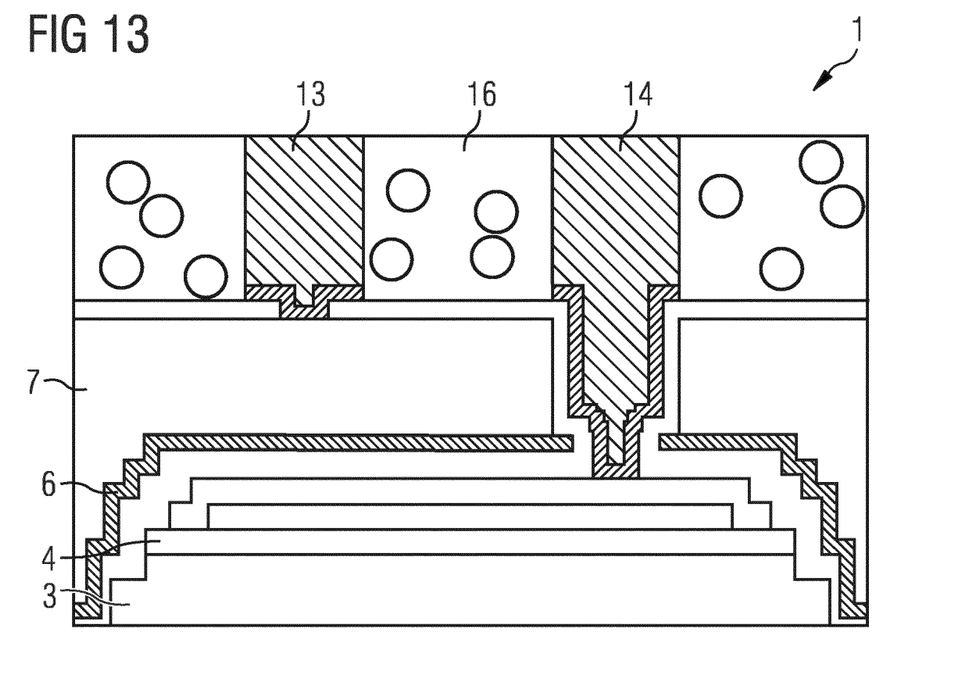
FIG. 13 shows a comparative example of a semiconductor component in a schematic cross-sectional view.

FIG. 13 shows a comparative example of a semiconductor component 1, which as a difference from the semiconductor components 1 described in connection with FIGS. 3 and 6, has a carrier layer 7 largely free of interruptions. As a consequence, because of the rigidity of the carrier layer 7, defects, for example cracks and delaminations, may occur in the course of production or mounting and impair the mechanical stability of the semiconductor component 1.

Figure 14:
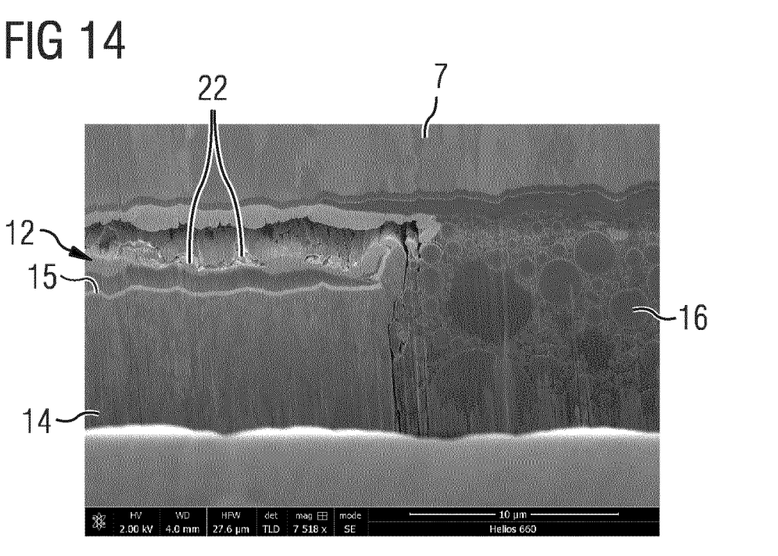
FIG. 14 shows an FIB (known as a focused ion beam) micrograph of a semiconductor component according to a comparative example.

FIG. 14 shows in an FIB micrograph a detail of the cross section of a comparative example, as illustrated in FIG. 13, of a semiconductor component that has a carrier layer 7 largely free of interruptions. The semiconductor component 1 exhibits defects 22 in the insulation layer 12, which defects can be prevented by means of structuring of the carrier layer 7.

The invention is not restricted by the description on the basis of the exemplary embodiments. Rather, the invention includes any novel feature and any combination of features, which includes in particular any combination of features in the patent claims, even if this feature or this combination itself is not explicitly specified in the patent claims or exemplary embodiments.

LIST OF REFERENCE SIGNS

1 Semiconductor component
1A, 1B Side face
2 Semiconductor body
2A First main face
2B Second main face
2C, 2D Side face
3 First semiconductor layer
3A Growth substrate
4 Second semiconductor layer
5 Active zone
6, 15 Seed layer
7 Carrier layer
7A, 7B Boundary face
8, 11 Cutout
9 Contact element
10, 10' Depression
12 Insulation layer
13 First connection contact
14 Second connection contact
16 Main body
16A Surface
17 Connection layer
18 Current spreading layer
19 Passivation layer
20 Wafer assemblage
21 Isolation trench
22 Defect
70 First region
71 Second region
a1, a2 Lateral extent
D1, D2 Thickness, total thickness
V Vertical direction
L, L1, L2 Lateral direction

The invention claimed is:

1. A semiconductor component comprising:
a semiconductor body having:
a first semiconductor layer and a second semiconductor layer;
a first main face and a second main face, situated opposite the first main face, wherein the first main face is formed by a surface of the first semiconductor layer and the second main face is formed by a surface of the second semiconductor layer;
at least one side face connecting the first main face to the second main face;
an electrically conductive carrier layer covering the second main face;
wherein the electrically conductive carrier layer is a continuous layer structured in such a way that it has at least one contact-free depression.

2. The semiconductor component as claimed in claim 1, wherein the contact-free depression, proceeding from a boundary face of the electrically conductive carrier layer facing the second main face, extends through the electrically conductive carrier layer as far as a boundary face of the electrically conductive carrier layer facing away from the second main face.

3. The semiconductor component as claimed in claim 2, wherein the at least one contact-free depression is surrounded fully circumferentially by the electrically conductive carrier layer.

4. The semiconductor component as claimed in claim 1, further comprising a filling arranged in the at least one contact-free depression, said filling having a higher elasticity than the electrically conductive carrier layer.

5. The semiconductor component as claimed in claim 1, wherein the at least one contact-free depression has regions having a different lateral orientation.

6. The semiconductor component as claimed in claim 5, wherein the at least one contact-free depression has a plurality of first regions, which have a first lateral orientation and are arranged in a manner laterally offset with respect to one another, and wherein the at least one contact-free depression has further regions, which have a different lateral orientation than the first lateral orientation and in each case connect two first regions to one another.

7. The semiconductor component as claimed in claim 1, wherein the electrically conductive carrier layer has the at least one contact-free depression comprises a plurality of contact-free depressions arranged in a manner laterally offset with respect to one another.

8. The semiconductor component as claimed in claim 1, which has a seed layer, on which the electrically conductive carrier layer is applied, wherein the seed layer has a structure corresponding to the electrically conductive carrier layer.

9. The semiconductor component as claimed in claim 1, which has a seed layer, on which the electrically conductive carrier layer is applied, wherein the seed layer has a different structure than the electrically conductive carrier layer.

10. The semiconductor component as claimed in claim 1, wherein the electrically conductive carrier layer is a metallic layer and contains at least one material selected from the group consisting of Ni, Cu, Au, Zn, Al, Sn, AuSn, or combinations thereof.

11. The semiconductor component as claimed in claim 1, wherein the electrically conductive carrier layer extends from the second main face to at least one side face of the semiconductor body.

12. The semiconductor component as claimed in claim 1, wherein the semiconductor body has at least one cutout which extends from the second main face in the direction of the first main face and which ends in the first semiconductor layer; wherein the electrically conductive carrier layer is arranged in the cutout and serves for electrically contacting the first semiconductor layer.

13. The semiconductor component as claimed in claim 1, wherein the electrically conductive carrier layer has at least one cutout different than the contact-free depression and in which is arranged a connection contact serving for electrically contacting the second semiconductor layer.

14. The semiconductor component as claimed in claim 1, further comprising a molded-on main body, on which the semiconductor body is arranged; wherein the electrically conductive carrier layer is arranged in a vertical direction between the semiconductor body and the molded-on main body.

15. A method for producing a semiconductor component as claimed in claim 1, wherein the method comprises:
   providing a semiconductor body having:
      a first semiconductor layer and a second semiconductor layer;
      a first main face and a second main face, situated opposite the first main face, wherein the first main face is formed by a surface of the first semiconductor layer and the second main face is formed by a surface of the second semiconductor layer;
      at least one side face connecting the first main face to the second main face;
   applying an electrically conductive carrier layer on the second main face;
   wherein the electrically conductive carrier layer is embodied with a structure in such a way that it has at least one contact-free depression;
   wherein the electrically conductive carrier layer is a continuous layer.

16. The method as claimed in claim 15, further comprising removing a growth substrate, on which the first and second semiconductor layers are arranged, from the semiconductor body using a laser lift-off method.

\* \* \* \* \*